(12) United States Patent
DiCaprio

(10) Patent No.: US 6,656,765 B1
(45) Date of Patent: Dec. 2, 2003

(54) FABRICATING VERY THIN CHIP SIZE SEMICONDUCTOR PACKAGES

(75) Inventor: Vincent DiCaprio, Mesa, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/496,991

(22) Filed: Feb. 2, 2000

(51) Int. Cl.[7] ............................................. H01L 21/44
(52) U.S. Cl. ....................... 438/106; 438/108; 438/118; 438/126; 438/977
(58) Field of Search ..................... 438/977, 64, 106, 438/107, 108, 110, 118, 125, 126, 127, 459

(56) References Cited

U.S. PATENT DOCUMENTS

| | | | | |
|---|---|---|---|---|
| 5,284,796 A | * | 2/1994 | Nakanishi et al. | 437/183 |
| 5,574,285 A | * | 11/1996 | Marion et al. | 250/370.13 |
| 5,594,275 A | | 1/1997 | Kwon et al. | |
| 5,597,766 A | * | 1/1997 | Neppi | 437/226 |
| 5,612,513 A | | 3/1997 | Tuttle et al. | 174/260 |
| 5,656,552 A | * | 8/1997 | Hudak et al. | 438/15 |
| 5,700,981 A | | 12/1997 | Tuttle et al. | 174/250 |
| 5,728,606 A | * | 3/1998 | Laine et al. | 438/122 |
| 5,729,437 A | | 3/1998 | Hashimoto | 361/760 |
| 5,776,798 A | | 7/1998 | Quan et al. | 438/112 |
| 5,783,870 A | | 7/1998 | Mostafazadeh et al. | |
| 5,863,815 A | * | 1/1999 | Egawa | 438/118 |
| 5,891,753 A | * | 4/1999 | Akram | 438/108 |
| 5,897,336 A | * | 4/1999 | Brouillette et al. | 438/108 |
| 5,920,769 A | | 7/1999 | Ball et al. | 438/113 |
| 5,930,597 A | * | 7/1999 | Call et al. | 438/106 |
| 5,930,598 A | * | 7/1999 | Wille et al. | 438/108 |
| 5,962,925 A | * | 10/1999 | Eifuku et al. | 257/778 |
| 5,973,263 A | | 10/1999 | Tuttle et al. | 174/52.2 |
| 5,981,314 A | | 11/1999 | Glenn et al. | 438/127 |
| 5,990,545 A | | 11/1999 | Schueller et al. | 257/697 |
| 6,060,373 A | * | 5/2000 | Saitoh | 438/459 |
| 6,063,649 A | * | 5/2000 | Yoshino | 438/118 |
| 6,081,038 A | * | 6/2000 | Murayama | 257/783 |
| 6,087,199 A | * | 7/2000 | Pogge et al. | 438/106 |
| 6,088,914 A | * | 7/2000 | Variot et al. | 29/840 |
| 6,096,574 A | * | 8/2000 | Smith | 438/106 |
| 6,103,549 A | * | 8/2000 | Master et al. | 438/106 |
| 6,103,554 A | * | 8/2000 | Son et al. | 438/126 |
| 6,107,120 A | * | 8/2000 | Ohtsuka et al. | 438/106 |
| 6,121,070 A | * | 9/2000 | Akram | 438/108 |
| 6,127,735 A | * | 10/2000 | Berger et al. | 257/778 |
| 6,180,881 B1 | | 1/2001 | Isaak | |
| 6,190,940 B1 | * | 2/2001 | DeFelice et al. | 438/106 |
| 6,223,429 B1 | | 5/2001 | Kaneda et al. | |
| 6,225,206 B1 | * | 5/2001 | Jimarez et al. | 438/616 |
| 6,235,554 B1 | | 5/2001 | Akram et al. | |
| 6,281,045 B1 | * | 8/2001 | Murata | 438/113 |
| 6,353,267 B1 | * | 3/2002 | Ohuchi et al. | 257/787 |
| 6,448,506 B1 | | 9/2002 | Glenn et al. | |

FOREIGN PATENT DOCUMENTS

| | | | | | |
|---|---|---|---|---|---|
| JP | 361071405 A | * | 9/1984 | | G11B/5/127 |
| JP | 64-1269 | | 1/1989 | | |
| JP | 404291993 A | * | 10/1992 | | H05K/3/36 |
| JP | 10256417 A | * | 9/1998 | | H01L/23/12 |
| JP | 411121525 A | * | 4/1999 | | H01L/23/12 |
| WO | 95/26047 | | 9/1995 | | |

* cited by examiner

*Primary Examiner*—Matthew Smith
*Assistant Examiner*—Renzo N Rocchegiani
(74) *Attorney, Agent, or Firm*—Bever, Hoffman & Harms, LLP; James E. Parsons

(57) ABSTRACT

A method for fabricating LGA-, LCCY- and BGA-types of very thin, chip size semi-conductor packages ("VCSP's") includes substantially reducing the thickness of a semiconductor wafer containing the semiconductor chips to be packaged by grinding and/or etching the wafer from its back side prior to singulation of the chips from the wafer. The thinned-down chips thus produced are electrically connected to corresponding insulative substrates contained in an integral array thereof using the "flip chip" interconnection method. The narrow row space between the chips and the substrates are sealed with an underfill material, and the individual, finished VCSP's are then singulated from the array.

18 Claims, 3 Drawing Sheets

FABRICATING VERY THIN CHIP SIZE SEMICONDUCTOR PACKAGES

BACKGROUND

1. Field of the Invention

This invention pertains to semiconductor packaging, and more particularly, to a method of fabricating a very thin chip size semiconductor package ("VCSP").

2. Description of the Related Art

An integrated circuit("IC") is formed on a single die, or "chip," that is cut from a semiconductor wafer containing a large number of identical dies. IC dies are relatively small and fragile, and are susceptible to harmful environmental elements, particularly moisture. Accordingly, for their effective use, they must be packaged in robust, yet affordable packages capable of protecting them from the environment and enabling them to be reliably mounted to, for example, a printed circuit board ("PCB") and interconnected with associated electronic components mounted thereon.

The recent trend toward miniaturized electronic devices, including cellular phones, laptop computers and their many peripherals, global positioning satellite ("GPS") receivers, and the like, has provided a strong incentive to the semiconductor packaging industry to develop correspondingly smaller IC packages that have enhanced functionality.

One response to this trend has been the recent development of so-called ball grid array ("BGA"), land grid array ("LGA"), and lead-less chip carrier ("LCC") packages that lack conventional leads, have a "footprint" the same size as the package, and are "chip sized," i.e., have virtually the same length and width as those of the IC chip contained therein. While these types of packages do afford a satisfactory response to the need for IC packages having smaller footprints and greater functionality, there is still room for their improvement, particularly in regard to their thickness, which has not seen a reduction corresponding to the reduction in size of their footprints.

The present invention effectively addresses the challenge of substantially reducing the thickness of IC packages by disclosing a method of manufacturing a BGA-, LGA- or LCC-type of very thin, chip size semiconductor package ("VCSP").

BRIEF SUMMARY OF THE INVENTION

The method of present invention enables fabrication of a "VCSP" having a length and width that are nearly the same as those of the semiconductor chip contained therein, and in one embodiment, a thickness of less than 40 mils (1 mil= $\frac{1}{1000}$ in.), i.e., less than 0.5 mm. In another embodiment, the VCSP's can be stacked one on top of the other to provide enhanced mounting density. The method is amenable to the simultaneous production of a large number of VSCP's in the form of an array.

The method comprises providing a semiconductor wafer having a first, front or "active," side with a plurality of finished IC chips formed integrally therein, an opposite second, "back" side, and a given thickness between the first and second sides. The thickness of the wafer is then substantially reduced from the back side of the wafer, which in one embodiment, comprises grinding the back side of the wafer down to remove a substantial portion of its thickness.

When the thickness of the wafer has been reduced by the desired amount, the individual IC chips are singulated from the wafer to provide a plurality of IC chips whose thickness is substantially reduced compared to that of conventional singulated IC chips.

An array of integral insulative substrates is provided, each substrate having a first surface with a plurality of metal pads thereon. The thinned-down chips are electrically connected to corresponding ones of the substrates in the array using the flip chip connection method.

The spaces between the chips and the substrates are underfilled with a liquid epoxy to seal the flip chip connection and the active surface of the chip against moisture. The individual substrates are then singulated close to the periphery of their associated chips to separate the individual VSCPs from the array. In an alternative embodiment, a margin of the top surface of the substrates around the periphery of the chips is left free of epoxy and is provided with a plurality of lands to which a second VSCP can be connected to the first in stacked fashion.

The above and other features and advantages of the present invention will be more readily understood from a consideration of the detailed description of the exemplary embodiments thereof set forth below, particularly if such consideration is made in conjunction with the accompanying drawings.

DETAILED DESCRIPTION OF THE INVENTION

Figure 1:
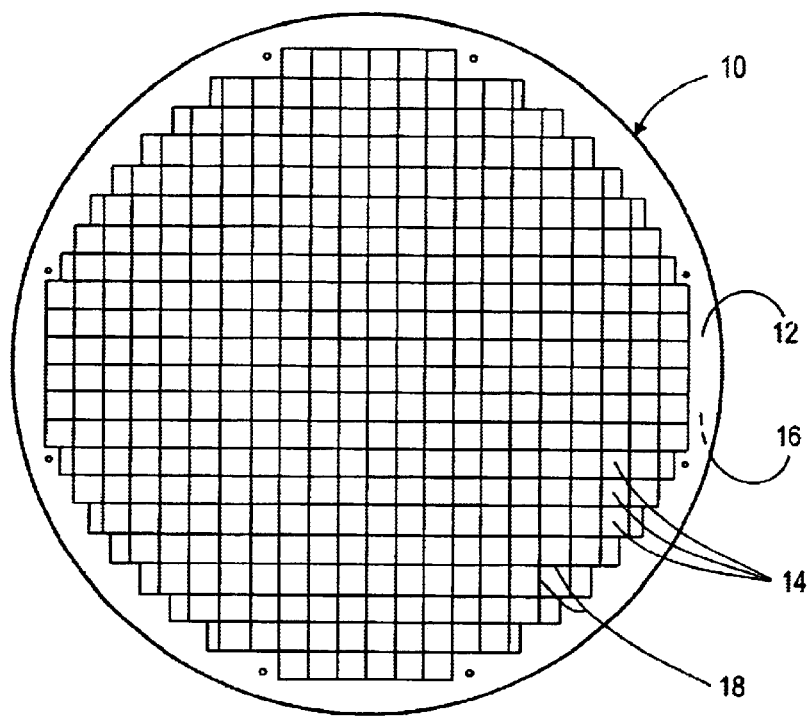
FIG. 1 is a top plan view of a semiconductor wafer having a plurality of IC chips formed integrally therein.

FIG. 1 is a top plan view of a typical semiconductor wafer 10 having a first, "active," front side 12, with a plurality of IC's 14 formed thereon; a back, or second side 16 opposite the front side (see FIG. 2); and, an initial thickness T1 between the front and back sides thereof.

Such wafers 10 are typically round, have a diameter of from about 5–8 inches, a thickness T1 of from about 10 to 27 mils (0.254 mm to 0.686 mm), and may have from less than a dozen to several hundred IC's 14 formed thereon using known photolithography techniques. The IC's may be separated from each other on the wafer by mutually orthogonal "streets" 18, i.e., lines scribed into the front side 12 of the wafer. In conventional IC packaging methods, after fabrication of the IC's is completed, the wafer is sawn or broken along the streets to "singulate," i.e., separate, the IC's from the wafer into individual dies, or "chips," 20 (see FIG. 3), each having one of the IC's 14 on a first, "active," surface 22 thereof, and a second surface 24 opposite to the first surface.

However, the method of the present invention differs somewhat from that of conventional IC package fabrication in order to achieve a very thin CSP. In particular, the method of the present invention comprises reducing the thickness of the wafer 10 from its first thickness T1 to a second thickness T2 that, in one embodiment, may range from between about 2 to 8 mils (0.051 mm to 0.203 mm), prior to singulation of the finished IC chips 20 from the wafer. This procedure is illustrated schematically in the cross-sectional side elevation view of FIG. 2.

Figure 2:
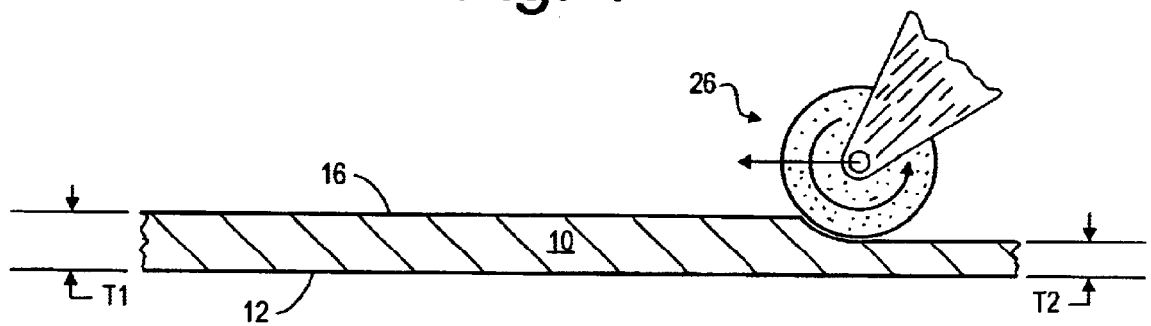
FIG. 2 is cross-sectional side elevation view showing the back side of the wafer seen in FIG. 1 being abrasively removed to reduce the thickness of the wafer.

In FIG. 2, the back side 16 of the wafer 10 is schematically shown being ground down abrasively, e.g., by a mechanical surface grinder 26. It is also possible to reduce the thickness of the wafer abrasively by removing the back side 12 of the wafer with a "centerless" rotary chemical-mechanical-polishing ("CMP") apparatus of a type well known in the semiconductor fabrication art.

In an alternative embodiment of the method, it is also possible to reduce the thickness of the wafer 10 by etching away the wafer from the back side 16 thereof in a known, controlled manner. For example, a "wet" liquid-chemical etching process, or alternatively, a "dry" plasma etching process, e.g., reactive ion etching ("RIE"), may be used to etch away the back side of the wafer to reduce its thickness to the desired value T2. It is also possible to use a combination of etching and abrasive methods to reduce the thickness of the wafer, the former to remove the majority of the material removed from the wafer, and the latter to "finish" the wafer to the desired end-thickness T2 and degree of parallelism between the wafer's front and back sides 12 and 16, respectively.

Figure 3:
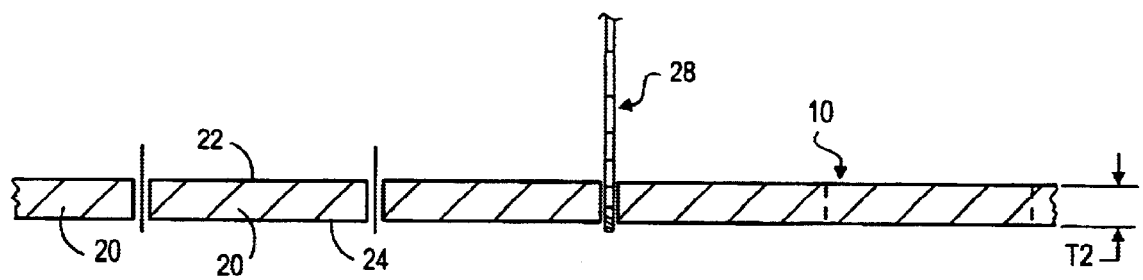
FIG. 3 is a cross-sectional side elevation view showing the reduced-thickness wafer of FIG. 2 being singulated into individual, thinned-down IC chips.

When the wafer 10 has been thinned-down to the desired end thickness T2, the individual IC chips 20 are singulated from it, e.g., by breaking the wafer along the streets 18, or by sawing it apart with, e.g., a diamond-bladed saw 28, as illustrated schematically in FIG. 3. The thickness T2 of the IC chips 20 thus produced, i.e., from about 2 to 8 mils (0.051 mm to 0.203 mm) is substantially less than that of conventional IC chips.

The sequential stages of the assembly of VCSP's from the reduced-thickness IC chips 20 is shown in FIGS. 4–7, respectively. Beginning with FIG. 4, the method of the present invention contemplates the provision of an array, e.g., in the form of a rectangular strip 30, of insulative substrates 32, which are integrally connected to one another within the array. In the exemplary embodiment illustrated in FIG. 4, the strip 30 comprises four groups of 16 identical substrates 32, for a total of 64 substrates per strip. It should be understood, however, that many other substrate array configurations are possible, depending on the particular application at hand. Further, in the embodiment illustrated, each group of 16 substrates is shown at a different stage of assembly from left to right in the strip. However, this is for illustrative purposes only, and it should be understood that, in the present invention, each of the packages in the entire strip 30 is operated on identically and simultaneously in each of the processes described below.

In one embodiment of the VCSP of the present invention, the material of the substrates 32 comprises a ceramic, such as silicon oxide, silicon carbide, G.A.S. quartz, alumina, aluminum nitride, or a laminate of one or more layers of the above materials such as is available from, e.g., Sumitomo Mining, Inc., or the Kyocera Corporation, both of Japan. Alternatively, the substrate material can comprise a so-called "thin core" laminate of, e.g., a polyimide resin, or a fiberglass matrix impregnated with an epoxy resin, such as are available from, e.g., the above Sumitomo Mining, or Ibiden USA, Inc., Santa Clara, Calif. In either case, the substrates are commercially available in thicknesses as small as 8 mils (0.2 mm).

Figure 4:
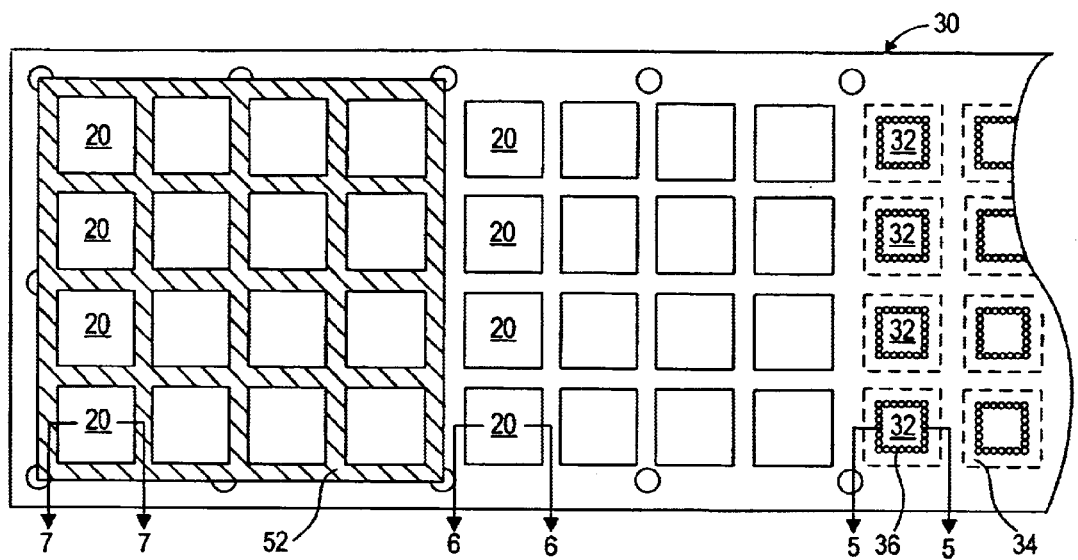
FIG. 4 is a partial top plan view of a strip array of insulative substrates having a plurality of sections in various stages of manufacture.
Figure 5:
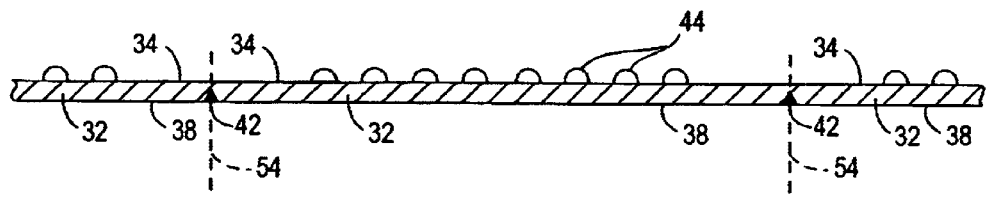
FIG. 5 is a cross-sectional view into the substrate array of FIG. 4 as revealed by the section taken therein along the lines 5—5.

As shown in FIGS. 4 and 5, each of the substrates 32 has a first surface 34 with plurality of metal pads 36 formed thereon, and a second surface 38 opposite the first surface with a plurality of lands (not illustrated) formed thereon. The pads 36 are conventionally connected to the lands through the thickness of the substrates by conductive traces and plated-through "via" holes (not illustrated). In the case of a VCSP of the LGA- or LCC-type of package, the lands serve as package input/output terminals, and in the case of a BGA-type of VCSP package, the lands serve to mount solder bumps 40 (see, e.g., FIGS. 7, 10, 13), which, in turn, serve as package input/output terminals.

In the case of ceramic substrate materials, the strip arrays 30 can comprise so-called "snapstrates," or "Snap Arrays," i.e., strips in which individual substrates 32 are separated from each other by lines 42 (see FIGS. 5–7) scribed into one, the other, or both surfaces of the strip to serve as stress raisers along which the substrates can broken apart, or singulated, from the strip arrays after package fabrication is complete.

In one embodiment, the present invention uses a "flip chip" method of electrical connection of the IC chips 20 to the substrates 32 to achieve the desirable thinness of the VCSP. The conventional flip-chip method of connecting chips to substrates was developed by IBM, Inc., in about 1965. Sometimes referred to as the "Controlled Collapse Chip Connection," or "C4," method (see, e.g., L. F. Miller, "Controlled Collapse Reflow Chip Joining," IBM J. Res. Develop., 239–250 (May 1969)), the technique conventionally involves forming metal bumps 44, e.g., of solder or gold, on metal pads (not illustrated) on the first, active, surfaces 22 of the IC chips 20, then inverting, or "flipping" the chips upside-down and fusing the bumps to corresponding ones of the metal pads 36 on the substrates 32. To facilitate bonding of the bumps 44 to the respective pads, it may be desirable to plate one or both sets of pads on the chips and the substrates with an under-bump metallization ("UBM"), such as gold, platinum, or nickel.

While it is possible to use this conventional flip chip technique in the method of the present invention, it has been found that it is easier to form the bumps 44 on the metal pads 36 on the substrates 32, rather than on the metal pads on the IC chips 20, because it has been found that it is very difficult to thin-down a wafer having solder bumps on it, and because it is difficult to form bumps on a wafer that has already been thinned down. Indeed, it has been found that there is a practical lower limit on the end-thickness to which wafers having bumps on them may be reduced of about 8–10 mils (0.20–0.25 mm). Thus, in one exemplary embodiment of the present invention, the metal bumps 44 are formed on the metal pads 36 of the substrates 32 (see FIGS. 4 and 5), and the metal pads on the chips 20 are provided with, e.g., a plating of a suitable UBM.

Figure 6:
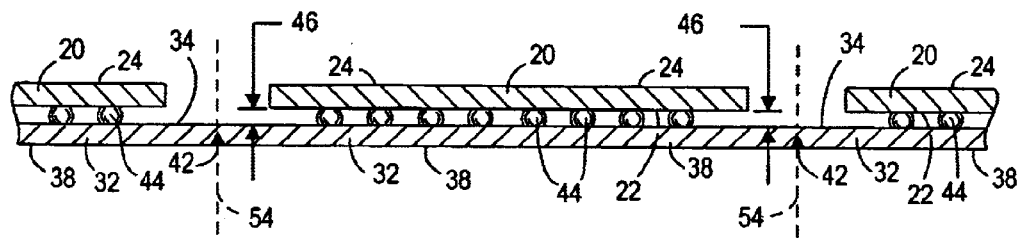
FIG. 6 is a cross-sectional view into the substrate array of FIG. 4 as revealed by the section taken therein along the lines 6—6.

As shown in FIGS. 4 and 6, after the bumps 44 have been formed on the substrates 32 of the strip array 30, the thinned IC chips 20 are inverted and placed on a corresponding one of the substrates (typically, using automated "pick-and-place" equipment), and the bumps 44 are "reflowed," e.g., in an oven, to electrically connect the pads on the chips to corresponding pads 36 on the substrates 32, with the second surfaces 24 of the chips facing up, and with the first surfaces 22 of the chips 20 in spaced opposition to the first surfaces 34 of the substrates 32 (see FIG. 6). In one embodiment, the narrow space 46 (see FIG. 6) between the opposing surfaces of each chip 20 and its corresponding substrate 32 is about 4 mils (0.1 mm) thick, and adjacent chips 20 are separated from each other by a gap 48 (see FIG. 7) of about 80 mils (2 mm).

Figure 7:
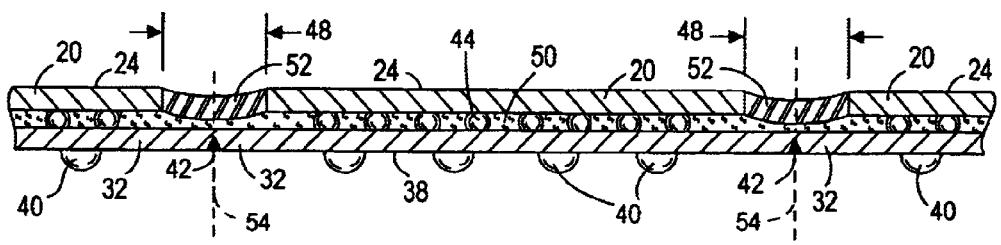
FIG. 7 is a cross-sectional view into the substrate array of FIG. 4 as revealed by the section taken therein along the lines 7—7.

After the IC chips 20 have been connected to the substrates 32, the narrow space 46 between their opposing surfaces is sealed to protect the active surfaces 22 of the chips containing the IC's 14 from harmful environmental agents, e.g., moisture, by "underfilling" the space 46 with a sealant, e.g., an epoxy resin 50 (see FIG. 7). In one embodiment, this is effected by dispensing a layer of a very low-viscosity epoxy resin, such as Nagase R3002, available from Nagase America, Inc., New York, N.Y., adjacent to the periphery of each chip 20 with the tip of the nozzle of a pressure dispenser (not illustrated), such that the liquid epoxy is fully "wicked" into the space 46 by capillary forces, and then curing it. Optionally, a second, "overfill," layer 52 of epoxy, such as Hysol 4451, available from Dexter, Inc., City of Industry, California, can be dispensed into the gap 48 between adjacent chips 20 and above the underfill layer 50 and cured so that it is flush with the second surfaces 24 of the chips for a more finished look of the packages.

In a BGA-type of VCSP package in accordance with the present invention, solder bumps 40 are formed on the lands on the second surfaces 38 of the substrates 32 prior to singulation of the individual packages 100 from the strip array 30, which is effected by sawing or snapping the substrates 32 around the peripheries of the individual chips 20, i.e., along the dotted lines 54 shown in FIGS. 5–7.

Figure 8:
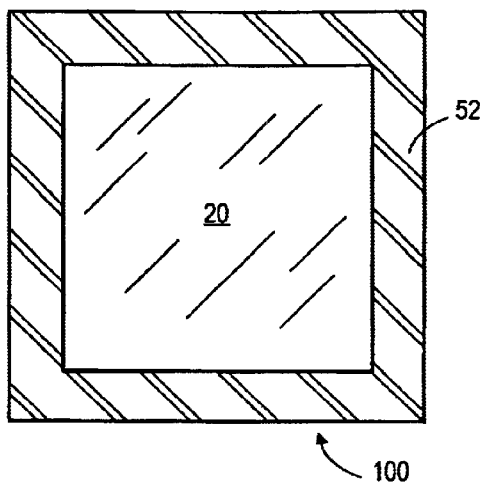
FIGS. 8–10 are top plan, cross-sectional side elevation, and bottom plan views, respectively, of one embodiment of a VCSP fabricated in accordance with the method of this invention; and, FIGS. 11–13 are top plan, cross-sectional side elevation, and bottom plan views, respectively, of a stacked pair of another embodiment of a VCSP fabricated in accordance with the method of this invention.
Figure 9:
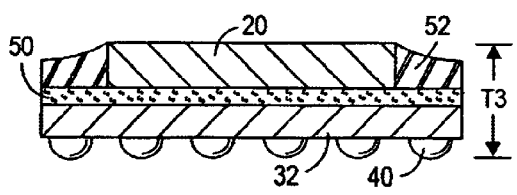
Figure 10:
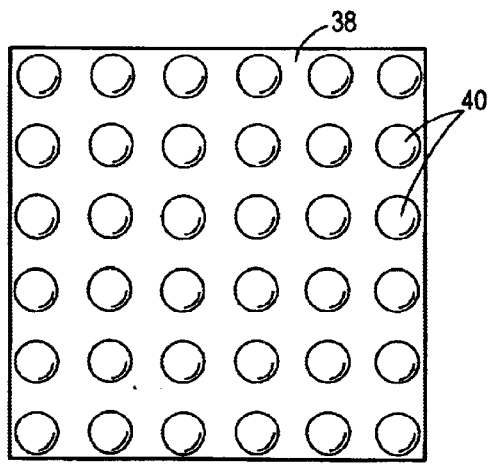

A first embodiment of such a VCSP 100 after singulation is shown in the top plan, cross-sectional side elevation, and bottom plan views of FIGS. 8–10, respectively. This embodiment, which may be square in plan view, can have a width of, e.g., from about 250 to 512 mils (6 to 13 mm) on a side, and a thickness T3 from the top of the package 100 to the bottom of the solder bumps 40 of less than 20 mils (0.5 mm).

Figure 11:
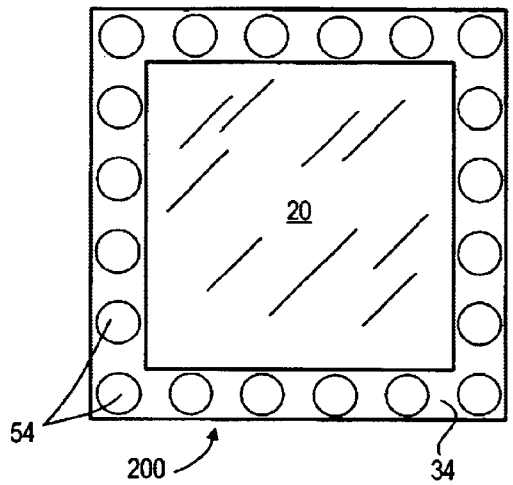
Figure 12:
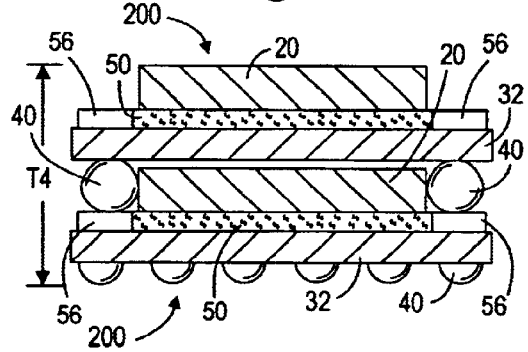
Figure 13:
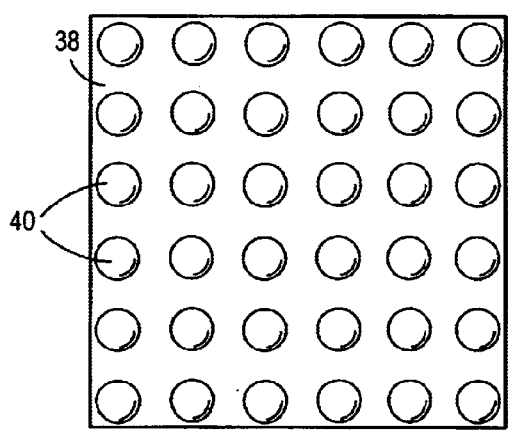

An alternative embodiment of a "stackable" BGA-type of VCSP 200 in accordance with the present invention is shown in the top plan, cross-sectional side elevation, and bottom plan views of FIGS. 11–13, respectively. The alternative VSCP 200 is fabricated substantially as described above in connection with the first embodiment of VSCP 100, except that the periphery of the substrate 32 is disposed further outboard of the periphery of the chip 20 than in the first embodiment, i.e., about 40 mils (1mm) further, so that a plurality of metal lands 56 can be formed on the first surface 34 of the substrate around its margin outboard of the chip 20 (see FIG. 11).

In this second embodiment, is desirable to mask the margin of the substrate 32 outboard of the chip 20 during the application of the underfill epoxy 50, and to omit the optional overfill epoxy 52, to prevent either from flowing out onto the lands 56. This embodiment has the advantage that two or more of such VCSP's 200 can be stacked on top each other and interconnected with solder bumps 40, as shown in FIG. 12. As in the first embodiment 100, the second VCSP 200 can be square and as small as about 250 mils (6 mm) on a side. Two of such packages, stacked one on top of the other as shown in FIG. 12, can have a thickness T4 from the top of the upper package to the bottom of the solder bumps 40 on the bottom of the lower package of less than 40 mils (1 mm).

Those of skill in the art will recognize that many variations and modifications are possible in terms of the materials and methods of the present invention without departing from its spirit. Accordingly, the scope of the present invention should be not by that of the exemplary embodiments described and illustrated herein, by that of the claims appended hereafter.

What is claimed is:

1. A method of making a very thin chip size semiconductor package ("VCSP"), comprising:
    providing an insulative substrate having a plurality of conductive pads on a first surface thereof, a plurality of lands on a second surface thereof, and means for electrically connecting the pads to the lands through the substrate;
    providing a semiconductor die having a first surface with a plurality of conductive pads thereon and a thickness substantially less than an initial thickness of a semiconductor wafer from which the die was singulated;
    forming a flip chip electrical connection between the die and the substrate; and,
    underfilling a space defined between the respective first surfaces of the die and the substrate and circumscribing a periphery of the die with a first insulative material; and
    filling a space around the periphery of the die and above the first insulative material with a second insulative material, said second insulative material contacting the first insulative material outward of the periphery of the die.

2. The method of claim 1, further comprising severing the substrate, the first insulative material, and the second insulative material, outward of the periphery of the die.

3. The method of claim 2, wherein said severing step is performed so that the substrate, the first insulative material, and the second insulative material have coplanar side walls.

4. The method of claim 2, wherein said severing step comprises snapping the substrate.

5. The method of claim 2, wherein the second insulative material contacts a sidewall of the die around the periphery of the die.

6. The method of claim 2, wherein said severing step comprises cutting with a saw through the substrate, the first insulative material, and the second insulative material.

7. The method of claim 1, wherein the second insulative material contacts a sidewall of the die around the periphery of the die.

8. The method of claim 1, wherein the second insulative material contacts a peripheral sidewall of the die between the first surface of the die and an opposite second surface of the die without covering the second surface of the die.

9. The method of claim 8, wherein solder bumps are provided on the metal pads of the substrate, the die lacks such solder bumps, and forming the flip chip electrical connection comprises reflowing the solder bumps of the substrate to form an electrical connection with the pads of the die.

10. The method of claim 1, wherein solder bumps are provided on the metal pads of the substrate, the die lacks such solder bumps, and forming the flip chip electrical connection comprises reflowing the solder bumps of the substrate to form an electrical connection with the pads of the die.

11. The method of claim 1, wherein the substrate is one of a plurality of identical, insulative substrates connected together in an integral array thereof, a plurality of said semiconductor die is provided, the flip chip electrical connection is formed between each said die and a respective one of the substrates of the array, and further comprising:

severing the array of substrates around a periphery of respective ones of the dies to singulate plural said packages from the array.

12. The method of claim 11, wherein the second insulative material contacts a peripheral sidewall of each said die between the first surface of the die and an opposite second surface of the chip without covering the second surface of the die.

13. The method of claim 12, wherein the severing step severs at least one of the first and second insulative materials outward of the periphery of each said die.

14. The method of claim 12, wherein said severing step is performed so that the substrate and the second insulative material have coplanar side walls.

15. The method of claim 11, wherein each die includes a second surface opposite the first surface thereof, the second insulative material spans a space over the first surface of the substrate between adjacent ones of said dies and contacts facing peripheral sidewalls of the adjacent said dies without covering the entire second surface of the dies.

16. The method of claim 11, wherein said severing step is performed so that the substrate, the first insulative material, and the second insulative material have coplanar side walls.

17. The method of claim 1, wherein the second insulative material contacts a peripheral sidewall of the die between the first surface of the die and an opposite second surface of the die, a portion of the second surface of the die being exposed.

18. The method of claim 17, wherein solder bumps are provided on the metal pads of the substrate, the die lacks such solder bumps, and forming the flip chip electrical connection comprises reflowing the solder bumps of the substrate to form an electrical connection with the pads of the die.

* * * * *